(12) United States Patent
Ni et al.

(10) Patent No.: US 10,866,613 B2
(45) Date of Patent: Dec. 15, 2020

(54) CONDUCTIVE PARTICLE, ANISOTROPIC CONDUCTIVE FILM, DISPLAY DEVICE, AND METHOD FOR FABRICATING THE SAME

(71) Applicants: BOE Technology Group Co., Ltd., Beijing (CN); Hefei Xinsheng Optoelectronics Technology Co., Ltd., Anhui (CN)

(72) Inventors: Huan Ni, Beijing (CN); Fengzhen Lv, Beijing (CN); Xinxia Zhang, Beijing (CN); Xiao Guo, Beijing (CN); Qun Li, Beijing (CN); Xiaolong Xie, Beijing (CN); Chengpeng Yao, Beijing (CN); Mingguang Li, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 0 days.

(21) Appl. No.: 15/752,107

(22) PCT Filed: Aug. 18, 2017

(86) PCT No.: PCT/CN2017/097990
§ 371 (c)(1),
(2) Date: Feb. 12, 2018

(87) PCT Pub. No.: WO2018/082363
PCT Pub. Date: May 11, 2018

(65) Prior Publication Data
US 2020/0183448 A1    Jun. 11, 2020

(30) Foreign Application Priority Data
Nov. 1, 2016  (CN) .......................... 2016 1 0943540

(51) Int. Cl.
*G02B 1/16* (2015.01)
*G06F 1/16* (2006.01)

(52) U.S. Cl.
CPC ............. *G06F 1/1609* (2013.01); *G02B 1/16* (2015.01); *G02B 2207/113* (2013.01)

(58) Field of Classification Search
CPC ........................................................ G02B 1/16
(Continued)

(56) References Cited

U.S. PATENT DOCUMENTS

| 5,120,591 A | 6/1992 | Tomita |
| 2005/0014026 A1* | 1/2005 | Park .................... H01L 51/0007 428/690 |

(Continued)

FOREIGN PATENT DOCUMENTS

| CN | 1367219 A | 9/2002 |
| CN | 104619801 A | 5/2015 |

(Continued)

OTHER PUBLICATIONS

International Search Report for PCT/CN2017/097990 dated Nov. 20, 2017.

(Continued)

*Primary Examiner* — Stanley Tso
(74) *Attorney, Agent, or Firm* — Arent Fox LLP; Michael Fainberg

(57) ABSTRACT

Disclosed are a conductive particle, an anisotropic conductive film, a display device, and a method for fabricating the same so as to detect the extent to which the conductive particles are cracked in a heating and pressurizing process, to thereby improve the ratio of finished products while the display device is being manufactured. A core of the conductive particle is a fluorescent resin core. In the conductive particle according to this disclosure, the core of the conduc- (Continued)

tive particle is a fluorescent resin core, and the extent to which the conductive particle is cracked can be detected by detecting varying fluorescence in a heating and pressuring process, to thereby alleviate such a phenomenon from taking place that the conductive particle has a poor electrical conductivity due to an insufficient pressure, or the conductive particle is cracked, and thus loses its electrical conductivity, due to an excessive pressure.

15 Claims, 5 Drawing Sheets

(58) Field of Classification Search
USPC .......................................................... 174/260
See application file for complete search history.

(56) References Cited

U.S. PATENT DOCUMENTS

| | | | |
|---|---|---|---|
| 2011/0091925 | A1 | 4/2011 | Ryan et al. |
| 2012/0089180 | A1* | 4/2012 | Fathi ......................... B32B 9/04 606/214 |
| 2013/0284934 | A1* | 10/2013 | Kaneko ................ A61B 6/4216 250/361 R |
| 2015/0175851 | A1* | 6/2015 | Redford ................... H01R 4/04 428/323 |
| 2018/0246581 | A1* | 8/2018 | Omata ..................... G09G 3/30 |
| 2019/0079619 | A1* | 3/2019 | Omata .................... G06F 3/041 |

FOREIGN PATENT DOCUMENTS

| | | |
|---|---|---|
| CN | 106297959 A | 1/2017 |
| JP | 2007165456 A | 6/2007 |

OTHER PUBLICATIONS

English translation of Chinese First Office Action for CN201610943540.2 , dated Apr. 1, 2017.
English translation of Chinese Second Office Action for CN201610943540.2 dated Jun. 14, 2017.
English translation of Chinese Third Office Action for CN201610943540.2, dated Dec. 6, 2017.

* cited by examiner

CONDUCTIVE PARTICLE, ANISOTROPIC CONDUCTIVE FILM, DISPLAY DEVICE, AND METHOD FOR FABRICATING THE SAME

CROSS-REFERENCE TO RELATED APPLICATIONS

This application is a National Stage of International Application No. PCT/CN2017/097990, filed Aug. 18, 2017, which claims priority of Chinese Patent Application No. 201610943540.2, filed Nov. 1, 2016, both of which are hereby incorporated by reference in their entireties.

FIELD

This disclosure relates to a conductive particle, an anisotropic conductive film, a display device, and a method for fabricating the same.

BACKGROUND

External pins of an array substrate are joined by joining pins of an integrated circuit chip with the respective external pins of the array substrate, where an anisotropic conductive film is used as a medium between them, and heated and pressurized, for example, to connect the pins of the integrated circuit chip with the external pins of the array substrate. While the anisotropic conductive film is being heated and pressurized, conductive particles in the anisotropic conductive film are flattened so that the pins of the integrated circuit chip can be connected with the external pins of the array substrate.

There is a low resistance of the conductive particles, and their on-resistance is determined by a contact resistance between the conductive particles and the external pins of the array substrate, and the number of conductive particles on the external pins of the array substrate, where the higher compression ratio is in some range, the larger the contact area is, and the lower the contact resistance is.

However while the anisotropic conductive film is being heated and pressurized, for example, if there is a too low pressure, then there may be such a low thermal conductivity that the resin can not react completely, so the conductive particles in the anisotropic conductive film are less deformed, and thus there is a low compression ratio, and there is a high contact resistance of the conductive particles, so that the pins of the integrated circuit chip can not be connected with the external pins of the array substrate; and if there is a too high pressure, then the conductive particles in the anisotropic conductive film may be cracked excessively, so that the pins of the integrated circuit chip, which are connected with the external pins of the array substrate are disconnected therefrom. While a display device is operating in a high-temperature environment, the integrated circuit chip may be deformed so that there is an increase in distance between the pins of the integrated circuit chip and the external pins of the array substrate, and thus the elasticity of the conductive particles disappears, thus resulting in short-circuiting between the pins of the integrated circuit chip, and the external pins of the array substrate.

In the related art, it is not convenient to detect in real time a damage condition of the conductive particles, and thus not convenient to control the pressure while the external pins of the array substrate are being joined, thus easily resulting in a lower ratio of finished products while the display device is being manufactured.

SUMMARY

Embodiments of this discourse provide a conductive particle, an anisotropic conductive film, a display device, and a method for fabricating the same so as to detect the extent to which the conductive particles are cracked in a heating and pressurizing process, to thereby improve the ratio of finished products while the display device is being manufactured.

In an aspect, this disclosure provides a conductive particle including a fluorescent resin core.

For example, the fluorescent resin core of the conductive particle is wrapped with at least one nontransparent layer through which no light is transmitted.

For example, the at least one nontransparent layer is a nontransparent conductive layer through which no light is transmitted.

For example, the nontransparent conductive layer a nontransparent metal layer through which no light is transmitted.

In some optional implementation, the fluorescent resin core is made of a fluorescent macromolecule material.

In some optional implementation, the fluorescent macromolecule material is polyaniline or polythiophene.

In some optional implementation, the core of each conductive particle is wrapped with a nickel layer wrapped with a gold-plating layer.

In another aspect, this disclosure further provides an anisotropic conductive film including a bonding layer in which there is a plurality of the conductive particles according to any one of the implementations above.

In still another aspect, this disclosure further provides a display device including an array substrate and an integrated circuit chip and the anisotropic conductive film as described above. The anisotropic conductive film is configured to connect external pins of the array substrate with pins of the integrated circuit chip.

In still another aspect, this disclosure further provides a method for manufacturing an anisotropic conductive film, the method includes: forming a plurality of conductive particles including fluorescent resin cores; and bonding the plurality of conductive particles to each other through an adhesive into a bonding layer.

For example, the method for manufacturing an anisotropic conductive film further includes each of the plurality of conductive particles including the fluorescent resin cores, is wrapped with at least one nontransparent layer through which no light is transmitted.

For example, the at least one nontransparent layer is a nontransparent metal layer through which no light is transmitted.

In some optional implementation, the fluorescent resin cores are formed by doping resin with fluorescent powder and a quantum dot fluorescent substance.

In some optional implementation, the fluorescent resin cores are formed by grafting fluorescent small-molecule into segments of a resin chain.

In some optional implementation, the fluorescent resin cores are made of a fluorescent macromolecule material.

In some optional implementation, the fluorescent macromolecule material can be polyaniline or polythiophene.

In still another aspect, this disclosure further provides a method for manufacturing a display device including an array substrate and an integrated circuit chip and the anisotropic conductive film according to any one of the implementations above, wherein the method includes: joining pins of the integrated circuit chip with respective external pins of the array substrate, wherein the anisotropic conductive film is arranged between the pins and the external pins; extruding the anisotropic conductive film using a pressure head arranged on an opposite side to a side of the integrated circuit chip on which the anisotropic conductive film is arranged, and emitting excited light to the conductive particles using a light source emitting device, and detecting fluorescence emitted by the conductive particles using a detecting device; and when a strength of the detected fluorescence reaches a predetermined value, stopping the pressure head from extruding, so that the external pins of the array substrate are connected with the pins of the integrated circuit chip.

For example, the predetermined value ranges from 1 nit to 10 nit.

BRIEF DESCRIPTION OF THE DRAWINGS

In order to make the technical solutions in the embodiments of this disclosure more apparent, the drawings in the embodiments will be introduced below in brief, and apparently the drawings to be described below are merely illustrative of some embodiments of this disclosure, but not intended to limit this disclosure thereto. In the drawings.

LIST OF REFERENCE NUMERALS

| 1  | Conductive particle         | 11 | Core                    |
|----|------------------------------|----|-------------------------|
| 12 | Nickel layer                | 13 | Gold-plating layer      |
| 2  | Anisotropic conductive film | 21 | Bonding layer           |
| 22 | Bottom mould                | 3  | Array substrate         |
| 31 | External pin                | 4  | Color filter substrate  |
| 5  | Pressure head               | 6  | Integrated circuit chip |
| 61 | Pin                         | 7  | Detecting device        |
| 8  | Buffer material layer       |    |                         |

DETAILED DESCRIPTION OF THE EMBODIMENTS

The technical solutions according to the embodiments of this disclosure will be described below clearly and fully with reference to the drawings in the embodiments of this disclosure, and apparently the described embodiments are only a part but all of the embodiments of this disclosure. Based upon the embodiments of this disclosure here, all of other embodiments derived by those ordinarily skilled in the art without any inventive effort shall come into the scope of this disclosure as claimed.

Unless defined otherwise, technical terms or scientific terms throughout this disclosure shall convey their usual meaning as appreciated by those ordinarily skilled in the art to which this disclosure pertains. The term "first", "second", or the like throughout this disclosure does not suggest any order, number or significance, but is only intended to distinguish different components from each other. The term "include", "comprise", or the like refers to that an element or an item preceding to the term encompasses an element(s) or an item(s) succeeding to the term, and its (or their) equivalence(s), but shall not preclude another element(s) or item(s). The term "connect", "connected", or the like does not only suggest physical or mechanical connection, but also includes electrical connection no matter whether it is direct or indirect. The terms "above", "below", "left", "right", etc., are only intended to represent a relative positional relationship, and when the absolute position of an object as described is changed, the relative positional relationship may also be changed accordingly.

The technical solutions according to the embodiments of this disclosure will be described below clearly and fully with reference to the drawings in the embodiments of this disclosure, and apparently the described embodiments are only a part but all of the embodiments of this disclosure.

First Embodiment

Figure 1:
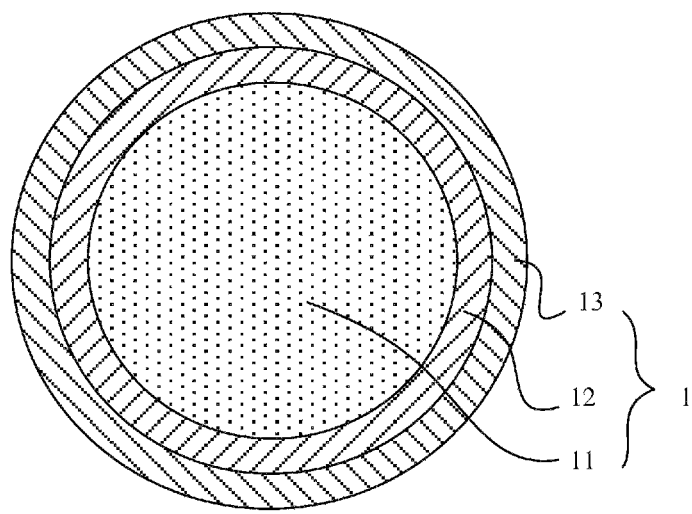
FIG. 1 is a schematic structural diagram of a conductive particle according to an embodiment of this disclosure.

As illustrated in FIG. 1 which is a schematic structural diagram of a conductive particle according to an embodiment of this disclosure, an embodiment of this disclosure provides a conductive particle 1 including a core 11 which is a fluorescent resin core.

For example, the fluorescent resin core of each conductive particle 1 is wrapped with at least one nontransparent layer through which no light is transmitted.

For example, the at least one nontransparent layer is a nontransparent conductive layer through which no light is transmitted.

For example, the nontransparent conductive layer is a nontransparent metal layer through which no light is transmitted.

In the conductive particle 1 according to the embodiment of this disclosure, the core of the conductive particle 1 is the fluorescent resin core, so that when the conductive particle is not cracked, the fluorescent resin core is wrapped with the layer through which no light is transmitted, and thus will not emit any fluorescence; and when the conductive particle is cracked, at least a part of the fluorescent resin core is exposed to emitted light, so that the extent to which the conductive particle 1 is cracked can be detected by detecting varying fluorescence in a heating and pressuring process, to thereby alleviate such a phenomenon from taking place that the conductive particle 1 has a poor electrical conductivity due to an insufficient pressure, or the conductive particle 1 is cracked, and thus loses its electrical conductivity, due to an excessive pressure.

Accordingly the conductive particle according to the embodiment of this disclosure has a good electrical conductivity, so the ratio of finished products while a display device is being manufactured can be improved.

Figure 2:
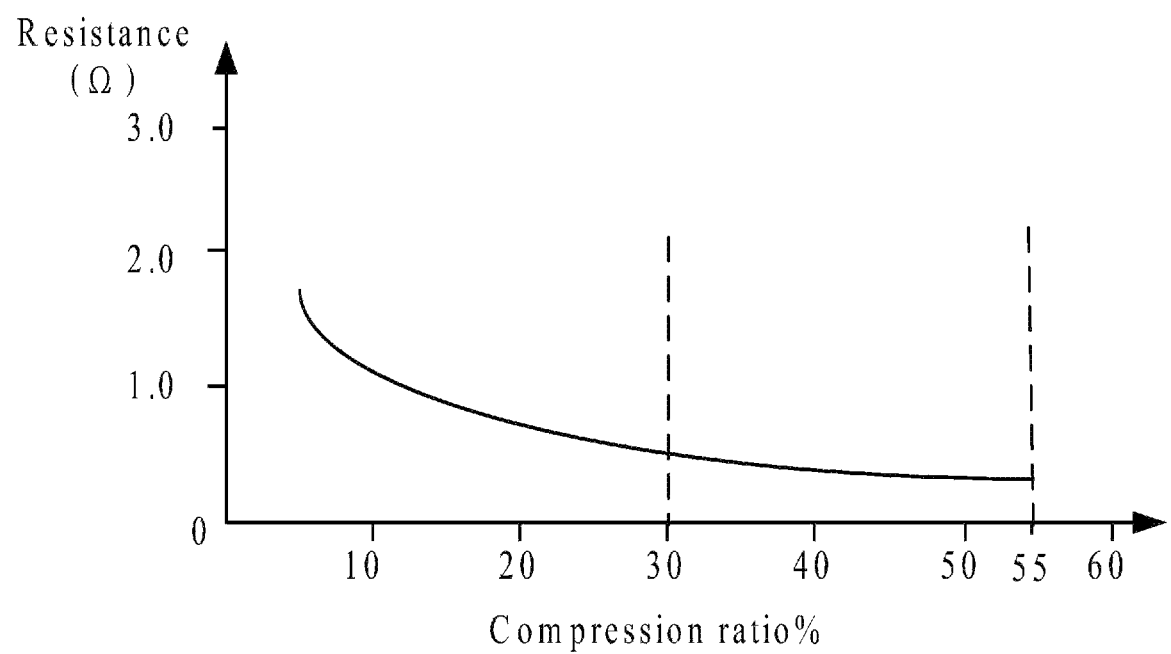
FIG. 2 is a schematic diagram of a varying electrical conductivity of the conductive particle according to an embodiment of this disclosure.
Figure 3A:
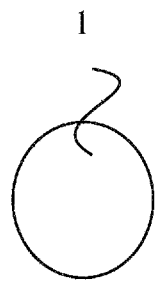
FIG. 3a to FIG. 3f are schematic diagrams of the conductive particle according to an embodiment of this disclosure, which is being cracked as a compression ratio varies.
Figure 3B:
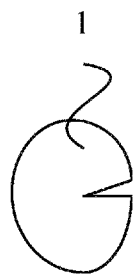
Figure 3C:
Figure 3D:
Figure 3E:
Figure 3F:

The conductive particle 1 according to the embodiment of this disclosure is increasingly damaged in the heating and pressuring process, and the extent to which the conductive particle 1 is cracked can be detected by detecting the varying fluorescence in the heating and pressuring process, to thereby avoid such a phenomenon from taking place that the conductive particle has a poor electrical conductivity due to an insufficient pressure, or the conductive particle is cracked excessively due to an excessive pressure and thus a too high compression ratio, and thus loses its elasticity, which may degrade the electrical conductivity thereof. As illustrated in FIG. 2, and FIG. 3a to FIG. 3f, FIG. 2 is a schematic diagram of a varying electrical conductivity of the conductive particle according to the embodiment of this disclosure; and FIG. 3a to FIG. 3f are schematic diagrams of the conductive particle according to the embodiment of this disclosure, which is being cracked as a compression ratio varies. As illustrated in FIG. 2, the resistance of the conductive particle 1 drops rapidly as the compression ratio is increasing between 0% and 30%, and FIG. 3a and FIG. 3b illustrate the corresponding extents to which the conductive particle 1 is damaged after being pressurized; the resistance of the conductive particle 1 drops slowly for the best effect as the compression ratio is increasing between 30% and 55%, and FIG. 3c and FIG. 3d illustrate the corresponding extents to which the conductive particle 1 is damaged after being pressurized; and the conductive particle 1 is crushed, and thus loses its electrical conductivity, as the compression ratio further increases, and FIG. 3e and FIG. 3f illustrate the corresponding extents to which the conductive particle 1 is damaged after being pressurized, where the conductive particle 1 loses its conductivity, thus resulting in circuit-breaking, which will incur poor circuit connectivity in the display device.

There may be a number of materials of the fluorescent resin core, and optionally the material of the fluorescent resin core is a fluorescent macromolecule material.

Optionally the fluorescent macromolecule material can be polyaniline or polythiophene.

The fluorescent resin core can be formed by doping resin with fluorescent powder and a quantum dot fluorescent substance, or can be formed by grafting small-molecule into segments of a resin chain.

As illustrated in FIG. 1, the core 11 of each conductive particle 1 is wrapped with a nickel layer 12 wrapped with a gold-plating layer 13, that is, the gold-plating layer is formed on the outside of the nickel layer in a gold-plating processes, where the gold-plating layer with which the nickel layer is wrapped is electrically conductive.

Second Embodiment

Figure 4:
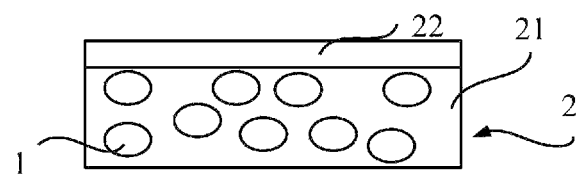
FIG. 4 is a schematic structural diagram of an anisotropic conductive film according to an embodiment of this disclosure.
Figure 5A:
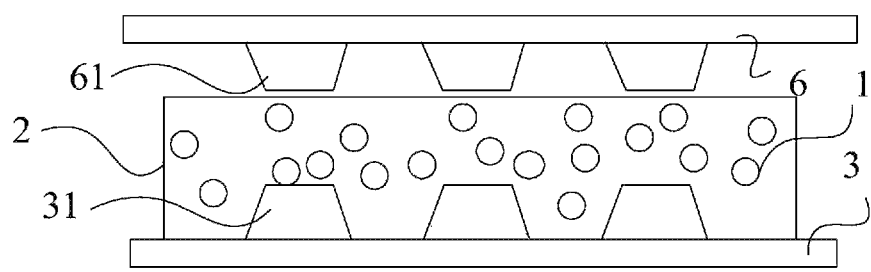
FIG. 5a and FIG. 5b are schematic diagrams of conductive particles in the anisotropic conductive film according to an embodiment of this disclosure, which are not pressured and pressured respectively.
Figure 5B:
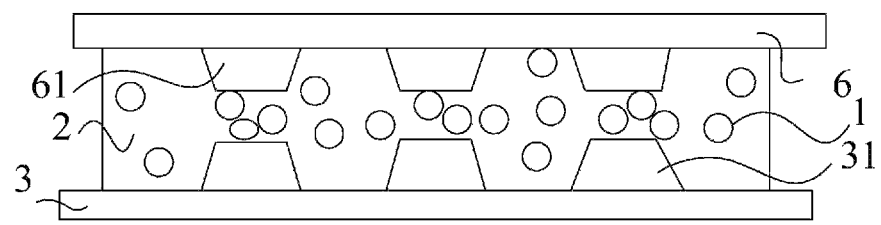

As illustrated in FIG. 4 which is a schematic structural diagram of an anisotropic conductive film according to an embodiment of this disclosure, an embodiment of this disclosure further provides an anisotropic conductive film 2 including a bonding layer 21 in which there is a plurality of the conductive particles 1 according to the embodiment above. The bonding layer can function to resist humidity, to resist heat, to insulate, and to maintain a contact area between an electrode and the conductive particles.

Typically the anisotropic conductive film 2 further includes a bottom mould 22 arranged to protect the bonding layer 21 from being contaminated from the outside while the anisotropic conductive film is being fabricated.

Third Embodiment

An embodiment of this disclosure further provides a method for fabricating an anisotropic conductive film, where the method includes the following steps.

Forming a plurality of conductive particles including fluorescent resin cores.

Bonding the plurality of conductive particles to each other through an adhesive into a bonding layer.

The bonding layer can be formed through coating and extrusion molding, and the conductive particles can be formed by coating material layers in sequence, where firstly the fluorescent resin cores are formed, then a nickel layer is coated on the outsides of the cores, and next a gold-plating layer is plated on the outside of the nickel layer.

In an optional implementation, the fluorescent resin core is formed by doping resin with fluorescent powder and a quantum dot fluorescent substance.

In an optional implementation, the fluorescent resin core is formed by grafting fluorescent small-molecule into segments of a resin chain.

In an optional implementation, the fluorescent resin core is made of a fluorescent macromolecule material.

Optionally the fluorescent macromolecule material can be polyaniline or polythiophene.

Fourth Embodiment

Figure 6A:
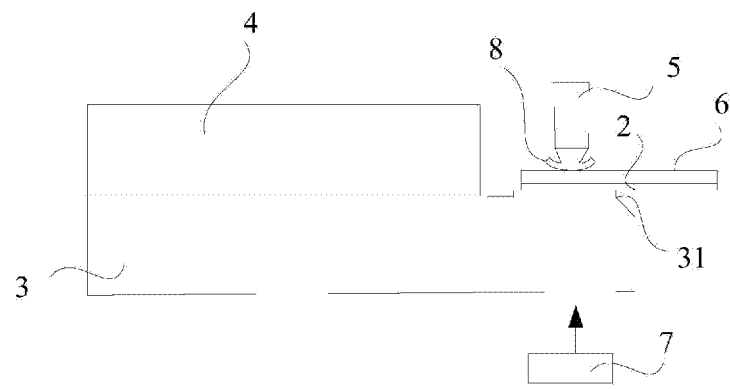
FIG. 6a and FIG. 6b are schematic state diagrams of pins of an integrated circuit chip being joined with external pins of an array substrate in a heating and pressuring process according to an embodiment of this disclosure.
Figure 6B:
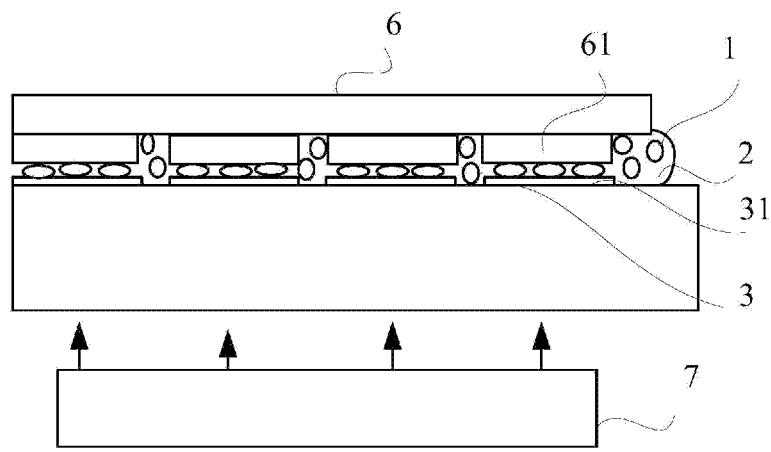

As illustrated in FIG. 6a and FIG. 6b, an embodiment of this disclosure further provides a display device including an array substrate 3 and an integrated circuit chip 6, and further including the anisotropic conductive film 2, as described above. The anisotropic conductive film 2 is configured to connect external pins 31 of the array substrate 3 with pins 61 of the integrated circuit chip 6. The display device generally further includes a color filter substrate 4 arranged to be aligned with the array substrate 3. Since the electrically-conductive particles in the anisotropic conductive film 2 of the display device according to the embodiment of this disclosure include the fluorescent resin cores 11, the display device can be manufactured by detecting the pressure in real time in a heating and pressurizing stage while the display device is being manufactured, to thereby avoid the pressure from being too high or low, so as to improve the stability of the connection between the pins 61 of the integrated circuit chip 6, and the external pins of the array substrate 3, so there is a good display effect of the display device according to the embodiment of this disclosure.

This embodiment further provides a method for manufacturing the display device above, where the method includes: joining the pins of the integrated circuit chip with the respective external pins of the array substrate, where the anisotropic conductive film is arranged between the pins and the external pins.

Extruding the anisotropic conductive film using a pressure head arranged on the opposite side to the side of the integrated circuit chip on which the anisotropic conductive film is arranged, and also emitting excited light to the conductive particles using a light source emitting device, and detecting fluorescence emitted by the conductive particles using a detecting device.

When the strength of the detected fluorescence reaches a predetermined value, stopping the pressure head extruding.

For example, the predetermined value ranges from 1 nit to 10 nit.

The manufacturing method above will be described below by way of an example with reference to the drawings.

As illustrated in FIG. 5a and FIG. 5b, and FIG. 6a and FIG. 6b, in the method for manufacturing a display device, the external pins of the array substrate 3 need to be joined by joining the pins 61 of the integrated circuit chip 6 with the respective external pins 31 of the array substrate 3, where the anisotropic conductive film 2 is used as a medium between the pins 61 and the external pins 31; and the conductive particles in the anisotropic conductive film 2 are extruded, for example, heated and pressured, using the pressure head 5 on the opposite side to the side of the integrated circuit chip 6 on which the anisotropic conductive film 2 is arranged, where a buffer material layer 8 is typically arranged between the pressure head 5 and the integrated circuit chip 6. While the pressure head is extruding, the conductive particles 1 may be deformed to thereby connect the pins 61 of the integrated circuit chip 6 with the external pins 31 of the array substrate 3. Also excited light is emitted to the conductive particles using the light source emitting device emitting UV or visible light, and fluorescence emitted by the conductive particles is detected using the detecting device 7; and since the conductive particles 1 include the fluorescent resin cores, while the conductive particles 1 in the anisotropic conductive film 2 are being extruded through heating and pressuring, the extent to which the conductive particles 1 are cracked can be detected by detecting the varying fluorescence through the detecting device 7, to thereby alleviate such a phenomenon from taking place that the pins of the integrated circuit chip 6 are disconnected from the external pins 31 of the array substrate 3 due to an insufficient pressure, and such a phenomenon from taking place that the conductive particles 1 are damaged, and thus lose their conductivity, due to an excessive pressure.

For example, the detecting device 7 can be arranged on one side of the array substrate, but in practice, it can be arranged elsewhere as long as the detecting device can emit the light to the conductive particles, and the detecting device can receive the fluorescence emitted by the conductive particles.

For example, the detecting device may emit the excited light to the conductive particles, and when the conductive particles are not cracked, the fluorescent resin cores in the conductive particles will not be excited; and when the conductive particles are cracked, the excited light will excite the fluorescent resin cores in the conductive particles, and the detecting device will receive the fluorescence. A correspondence relationship equation between the extents, to which the conductive particles are cracked, corresponding to different fluorescent strengths, and the pressure to which they are subjected can be defined empirically, and while the conductive particles are being detected, the extent to which the conductive particles are damaged can be determined using the fluorescent strength according to the relationship equation defined empirically in advance.

For example, the fluorescent strength measured by the detecting device is proportional to the corresponding extent to which the conductive particles are cracked, so the higher extent to which the conductive particles are damaged, the higher the fluorescent strength measured by the detecting device is; and the fluorescent strength corresponding to the extent to which the conductive particles are cracked as illustrated in FIG. 3d can range from 1 nit to 10 nit, for example.

For example, in the states as illustrated in FIG. 3a to FIG. 3c, the fluorescent strength measured by the detecting device 7 is lower, and at this time, the pressure head further applies a pressure until the fluorescent strength measured by the detecting device 7 lies in the range of 1 nit to 10 nit, where the conductive particles are cracked to the extent as illustrated in FIG. 3d, and at this time the pressure is stopped from being applied, so that the external pins of the array substrate are connected with the pins of the integrated circuit chip because if the pressure were further applied, then the conductive particles would have been cracked to such an extent that the conductive particles would have been damaged, and thus lost their conductivity.

The conductive particle according to this disclosure includes the fluorescent resin core, and the extent to which the conductive particle is cracked can be detected by detecting the varying fluorescence in the heating and pressurizing process, to thereby alleviate such a phenomenon from taking place that the conductive particle has a poor electrical conductivity due to an insufficient pressure, or the conductive particle is cracked, and thus loses its electrical conductivity, due to an excessive pressure.

Accordingly the conductive particle according to this disclosure has a good conductivity, and can improve the ratio of finished product while the display device is being manufactured.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. An anisotropic conductive film, comprising a conductive particle, comprising a core which is a fluorescent resin core,
and a bonding layer in which there is a plurality of the conductive particles, wherein the anisotropic conductive film is formed by a method of:
joining pins of an integrated circuit chip with respective external pins of an array substrate,
wherein the anisotropic conductive film is arranged between pins and external pins;
extruding the anisotropic conductive film using a pressure head arranged on an opposite side to a side of the integrated circuit chip on which the anisotropic conductive film is arranged,
and emitting excited light to the conductive particles using a light source emitting device,
and detecting fluorescence emitted by the conductive particles using a detecting device; and
when a strength of detected fluorescence reaches a predetermined value, ranging from 1 nit to 10 nit, stopping the pressure head from extruding, so that the external pins of the array substrate are connected with the pins of the integrated circuit chip.

2. The conductive particle according to claim 1, wherein the fluorescent resin core of the conductive particle is wrapped with at least one nontransparent layer through which no light is transmitted.

3. The conductive particle according to claim 2, wherein the at least one nontransparent layer is a nontransparent conductive layer through which no light is transmitted.

4. The conductive particle according to claim 3, wherein the nontransparent conductive layer is a nontransparent metal layer through which no light is transmitted.

5. The conductive particle according to claim 4, wherein the core of the conductive particle is wrapped with a nickel layer wrapped with a gold-plating layer.

6. The conductive particle according to claim 1, wherein the fluorescent resin core is made of a fluorescent macromolecule material.

7. The conductive particle according to claim 6, wherein the fluorescent macromolecule material is polyaniline or polythiophene.

8. A display device, comprising:
an array substrate and an integrated circuit chip; and
the anisotropic conductive film according to claim 1, wherein the anisotropic conductive film is configured to connect external pins of the array substrate with pins of the integrated circuit chip.

9. A method for manufacturing an anisotropic conductive film, the method comprises:
forming a plurality of conductive particles comprising fluorescent resin cores;
bonding the plurality of conductive particles to each other through an adhesive into a bonding layer;
joining pins of an integrated circuit chip with respective external pins of an array substrate,
wherein the anisotropic conductive film is arranged between pins and external pins;
extruding the anisotropic conductive film using a pressure head arranged on an opposite side to a side of the integrated circuit chip on which the anisotropic conductive film is arranged,
and emitting excited light to the conductive particles using a light source emitting device,
and detecting fluorescence emitted by the conductive particles using a detecting device; and
when a strength of detected fluorescence reaches a predetermined value ranging from 1 nit to 10 nit, stopping the pressure head from extruding, so that the external pins of the array substrate are connected with the pins of the integrated circuit chip.

10. The method for manufacturing an anisotropic conductive film according to claim 9, wherein each of the plurality of conductive particles comprising the fluorescent resin cores is wrapped with at least one nontransparent layer through which no light is transmitted.

11. The method for manufacturing an anisotropic conductive film according to claim 10, wherein the at least one nontransparent layer is a nontransparent metal layer through which no light is transmitted.

12. The method for manufacturing an anisotropic conductive film according to claim 9, wherein the fluorescent resin cores are formed by doping resin with fluorescent powder and a quantum dot fluorescent substance.

13. The method for manufacturing an anisotropic conductive film according to claim 9, wherein the fluorescent resin cores are formed by grafting fluorescent small-molecule into segments of a resin chain.

14. The method for manufacturing an anisotropic conductive film according to claim 9, wherein the fluorescent resin cores are made of a fluorescent macromolecule material.

15. The method for manufacturing an anisotropic conductive film according to claim 14, wherein the fluorescent macromolecule material is polyaniline or polythiophene.

* * * * *